United States Patent
Hsia et al.

(10) Patent No.: US 7,251,158 B2
(45) Date of Patent: Jul. 31, 2007

(54) ERASE ALGORITHM FOR MULTI-LEVEL BIT FLASH MEMORY

(75) Inventors: Ed Hsia, Saratoga, CA (US); Darlene Hamilton, San Jose, CA (US); Fatima Bathul, Cupertino, CA (US); Masato Horiike, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 621 days.

(21) Appl. No.: 10/864,947

(22) Filed: Jun. 10, 2004

(65) Prior Publication Data

US 2005/0276120 A1    Dec. 15, 2005

(51) Int. Cl.
*G11C 11/34* (2006.01)
(52) U.S. Cl. .................... 365/185.03; 365/185.29; 365/185.3
(58) Field of Classification Search ........... 365/185.03, 365/185.29, 185.3
See application file for complete search history.

(56) References Cited

U.S. PATENT DOCUMENTS

| | | | |
|---|---|---|---|
| 5,953,255 | A | 9/1999 | Lee |
| 6,621,741 | B2 | 9/2003 | Yano |
| 6,628,544 | B2 | 9/2003 | Shum et al. |
| 6,657,897 | B2 * | 12/2003 | Watanabe et al. ...... 365/185.29 |
| 2001/0043492 | A1 | 11/2001 | Lee et al. |
| 2003/0185057 | A1 | 10/2003 | Shum et al. |

FOREIGN PATENT DOCUMENTS

EP    0 932 161 A1    7/1999

OTHER PUBLICATIONS

International Search Report, Int'l Application No. PCT/US2005/004539, Int'l Filing Date Feb. 11, 2005, 2 pgs.

\* cited by examiner

*Primary Examiner*—VanThu Nguyen
(74) *Attorney, Agent, or Firm*—Eschweiler & Associates, LLc

(57) ABSTRACT

Methods of erasing a sector of multi-level flash memory cells (MLB) having three or more data states to a single data state are provided. The present invention employs an interactive sector erase algorithm that repeatedly erases, verifies, soft programs, and programs the sector in two or more erase phases to achieve highly compact data state distributions. In one example, the algorithm essentially erases all the MLB cells of the sector to an intermediate state and corresponding threshold voltage value using interactive erasing, soft programming and programming pulses in a first phase. Then in a second phase, the algorithm further erases all the MLB cells of the sector using additional interactive erasing and soft programming pulses until a final data state is achieved corresponding to a desired final threshold voltage value of the cells. Optionally, the algorithm may include one or more additional phases of similar operations that successively bring the memory cells of the sector to a compacted common erased state in preparation for subsequent programming operations. In one aspect of the method, the actual threshold values and/or data states chosen for these phases may be predetermined and input to the memory device by the user.

42 Claims, 8 Drawing Sheets

(Initially: cells programmed to various logical states and corresponding Vt levels)

(step 1: erase all cells to L2)

(step 2: soft program over-erased cells up to L1)

(step 3: program all remaining (L1) cells up to L2)

(step 4: erase all cells to L1)

(step 5: soft program over-erased cells up to L1)

ERASE ALGORITHM FOR MULTI-LEVEL BIT FLASH MEMORY

FIELD OF INVENTION

The present invention relates generally to memory devices and the like, and in particular to a method of erasing sectors of cells with multiple-level data states in flash memory devices.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks ease of erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc. as well as in many larger electronic systems, such as cars, planes, industrial control systems, etc.

Flash memory is generally constructed of many memory cells where, generally, single bits of data are stored in and read from respective memory cells. The cells are generally programmed by hot electron injection and erased by Fowler-Nordheim tunneling or other mechanisms. As with many aspects of the semiconductor industry, there is a continuing desire and effort to achieve higher device packing densities and increase the number of memory cells on a semiconductor wafer. Similarly, increased device speed and performance are also desired to allow more data to be stored on smaller memory devices.

Individual flash memory cells are organized into individually addressable units or groups, which are accessed for read, program, or erase operations through address decoding circuitry. The individual memory cells are typically comprised of a semiconductor structure adapted for storing a bit of data and includes appropriate decoding and group selection circuitry, as well as circuitry to provide voltages to the cells being operated upon.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

Programming circuitry controls a bit of a cell by applying a signal to a wordline, which acts as a control gate, and changing bitline connections such that the bit is stored by the source and drain connections. Programming a cell using a suitable mechanism such as hot electron injection, generally increases the threshold voltage of a cell. Erasing is performed as a blanket operation wherein an array or sector of cells can be simultaneously erased and typically produces a lower threshold voltage in the cell.

In the blanket erasing of flash memory, cells within an array or sector are typically erased concurrently and can be accomplished by one or more applications of short erase pulses. After each erase pulse, an erase verification or read can be performed to determine if each cell in the array is now "erased" (blank), or yet remains "un-erased" or "under-erased", (e.g., whether the cell has a threshold voltage above a predetermined limit). If an under-erased cell is detected, an additional erase pulse can be applied to the entire array until all cells are sufficiently erased. With such an erase procedure, however, some cells may become "over-erased" before other cells are sufficiently erased. A memory cell having a threshold voltage erased below a predetermined limit, for example, may be commonly referred to as being over-erased. For several reasons it is undesirable for a memory cell to remain in an over-erased condition.

Regardless of the flash architecture employed, accurately erasing and programming multiple level flash cells can be particularly sensitive with the attendant complications of maintaining narrow Vt distributions in order to accurately read and determine a data state from a corresponding Vt level. In addition, even if such narrow distributions are attained for the various multiple levels, unless sectors of memory cells can be erased to within the acceptable limits quickly, efficiently, and reliably, little competitive advantage may be gained.

In view of the foregoing, a need exists for an improved method of erasing a sector or array of multi-level flash memory cells.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention erases a sector or array of multi-level bit flash memory cells (MLB) to a single bit state (data state) by applying an interactive sector erase algorithm that erases, verifies, soft programs, and programs the sector in two or more erase phases (or tiers) to achieve highly compact Vt distributions. The algorithm provides Vt distributions, which have an improved sigma over that obtainable with some conventional single phase methods. In one example, the algorithm erases all the MLB cells of the sector to an intermediate state corresponding to an intermediate threshold voltage value, using interactive erasing, soft programming and programming pulses in a first phase. The first phase brings the memory cells to the same logical state and closer to the same threshold voltage. Then in a second phase, the algorithm is used to further compact the distribution of the threshold voltage levels about a final data state. In the second phase of the present invention the algorithm again erases all the MLB cells of the sector using additional interactive erasing, and soft programming pulses until the desired final threshold voltage value of the cells corresponding to a final data state is achieved.

The multi-level bit MLB flash memory cell of the present invention may comprise a single physical bit that can be programmed to three or more levels corresponding to three or more data states. Alternately, the MLB cell may comprise a dual-bit or mirror-bit cell having two physically distinct bits that may each be programmed to multiple levels such as four, wherein 16 possible states are then available. The method may be suitably implemented in a variety of flash memory architectures including single and dual bit EEPROM, and other such single or multi-bit memory architectures that may be electrically erased, and any such cell or variant is contemplated as falling within the scope of the present invention.

A further aspect of the algorithm of the present invention includes an additional phase of similar erase and soft program operations that may be used to further compact the threshold voltage distributions of the memory cells. In the additional phase, a second intermediate logical state is chosen between the intermediate state and the final state. After the cells are erased, programmed and soft programmed to the intermediate state, the cells are erased and soft programmed to the second intermediate state and then finally to the final data state in a similar manner. Any number of such intermediate phases may be applied to the method including the total number of data states utilized by the sector or array of MLB memory cells.

In this way, the memory cells are erased to a common erased state having a narrow Vt distribution in preparation for subsequent programming and read operations. In one aspect of the method, the actual threshold values and data states chosen for these phases may be predetermined and input to the memory device by a user.

In one method and implementation of the present invention, the memory cells of the sector have four data states L1, L2, L3, and L4 corresponding to four respective threshold voltage values, for example. The method erases the memory cells to an intermediate threshold voltage value corresponding to the L2 data state in a first phase operation, and then in a second phase operation erases the memory cells to a final threshold voltage value corresponding to the L1 data state.

In accordance with another aspect of the sector erase algorithm of the present invention, the memory cells are initially programmed to various states. Another aspect of the invention provides a method of erasing multiple sectors of the array including the entire array. The present invention provides a method of erasing a sector of an array of MLB memory cells that yields a well controlled low sigma Vt distribution using a minimal erase time, while maintaining a device endurance and reliability status.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
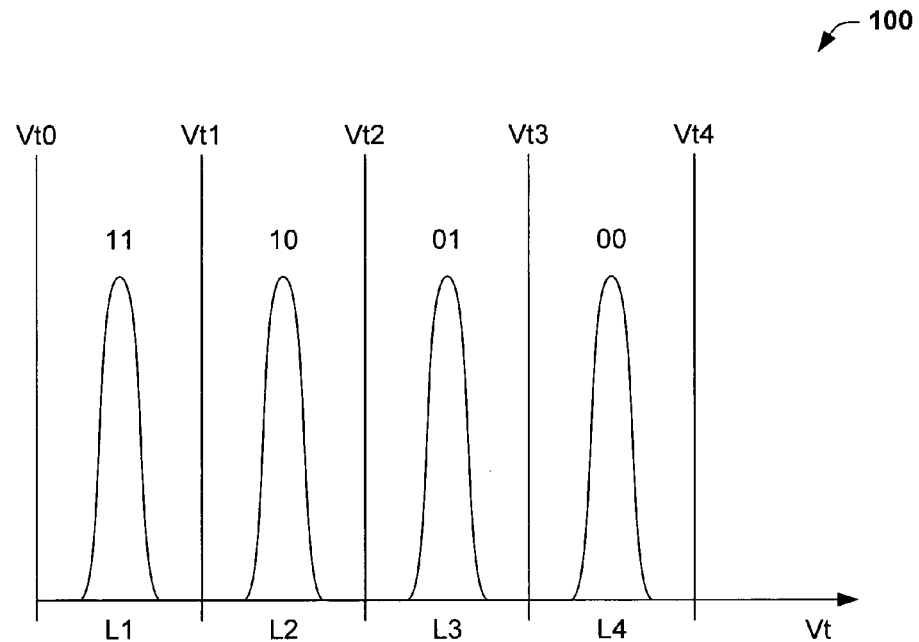
FIG. 1 is a Vt distribution of a four level multi-level cell in accordance with an aspect of the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

Improvements in the density of memory devices translate to increased memory capacity. Density and thus capacity is a major consideration in the cost of fabrication and the marketability of memory devices, and is directly related to the amount of real estate used to store a bit of information on a semiconductor chip. Density may be increased, for example, by scaling down feature size to accommodate more memory cell transistors on a given size chip thereby achieving higher density. Another technique to increase density and reduce manufacturing costs is thru the use of multi-level cell technology.

Multi-level cells increase cell density by increasing the number of possible logical states or data states associated with a cell, thereby allowing a single memory cell to store information corresponding to more than one data bit. One way this has been done is by using multiple (three or more, in the context of cell levels and states) threshold voltage (Vt) levels, which correspond to multiple data states per cell. This contrasts to the two states and levels used in conventional flash memory cells. Thus, in one example, a single mirror bit cell may store two physical bits of data each at four Vt levels corresponding to four logical states. Cells, having multiple levels, however, present many new problems attempting to maintain well controlled or tight distributions of the Vt levels, particularly as larger data bit quantities are considered.

As a result of these trends, accurate erasure and the determination of the levels of such multi-level cells becomes increasingly demanding, particularly as higher bit capacities are expected of a single cell. Accordingly, multi-level memory cells need to be erased quickly and efficiently to save erase operations time and power consumption. In addition, the cells need to be erased to a well controlled narrow erase distribution (tight bit compacting) to insure subsequent program operations also will produce narrow program Vt distributions. Such device requirements and issues are likely to increase as device features continue to shrink and the density of memory cells increases.

Memory device manufactures often guarantee specific values of speed, endurance, reliability, and the power consumed during a variety of operating modes. These device specifications or operating parameters are beneficial to the user to insure a device performs as intended. Accordingly, it is a goal of the present invention to provide a method of erasing a sector or array of suitable MLB flash memory cells, which achieves the aforementioned requirements while also providing the specific values of speed, endurance, reliability, and the power consumed during the applicable operating modes.

A sector erase algorithm may be used to erase a specified sector or multiple sectors of an array of multi-level flash memory cells MLB to a single data state. The erase algorithm of the present invention may be applied in two or more erase phases (or tiers), for example. The algorithm achieves well controlled compact Vt distributions compared to those of some conventional single phase methods. The method may be suitably implemented in a variety of flash memory architectures including single and dual bit EEPROM, and other such single or multi-bit memory architectures that may be electrically erased, and any such cell or variant is contemplated as falling within the scope of the present invention.

In a first phase, the algorithm of the present invention erases all the MLB cells of the sector or cell group to an intermediate state corresponding to an intermediate threshold voltage value, and then applies interactive erase, soft program and program pulses. The first phase brings the memory cells to the same logical state and closer to the same threshold voltage. Then, in a second phase, the algorithm is used to further compact the distribution of the threshold voltage levels about a final data state. In the second phase of the present invention the algorithm again erases all the MLB cells of the sector using additional interactive erasing, and soft programming pulses until the cells achieve a desired final threshold voltage value corresponding to a final data state.

Referring initially to FIG. 1, an unsigned Vt distribution 100 of a four level MLB cell in accordance with an aspect of the present invention is illustrated. Vt distribution 100 represents a population of memory cell threshold voltages centered about four discrete target threshold voltages. Each target threshold voltage occupies a range of Vt values designated by levels L1, L2, L3, and L4, respectively. Ideally, each level would be centered between upper and lower Vt limits, for example, Vt0, Vt1, Vt2, Vt3, and Vt4. The various levels may be arbitrarily assigned corresponding binary states (e.g., L1=11, L2=10, L3=01, and L4=00, or L1=00, L2=01, L3=10, and L4=11) as desired by the us The four level MLB cell associated with the distribution 100 may comprise a single physical bit that can be programmed to four levels, or alternatively, may comprise a dual-bit or mirror-bit cell having two physically distinct bits that may each be programmed to multiple levels such as four, wherein 16 possible states are then available.

The method of the present invention is suitably implemented in MLB memory devices having any combination of both positive and negative Vt distributions. In FIG. 1, for example, the method of the present invention is equally applicable whether Vt0, Vt4, or another such Vt limit is used as a zero voltage potential or another reference potential of the memory cells. Considering the four level, single-bit memory cell example of FIG. 1, the method of the present invention may be used to erase all memory cells initially programmed to L3 and L4 data states to an intermediate threshold voltage value corresponding to the L2 data state in a first phase operation. Then in a second phase operation, the method is used to erase the memory cells to a final threshold voltage value corresponding to the L1 data state, as will be discussed in greater detail infra. Although the example would seem to imply that the L1 level corresponds to the erased condition, the L1, L4, or any other level may represent the erased state.

Figure 2:
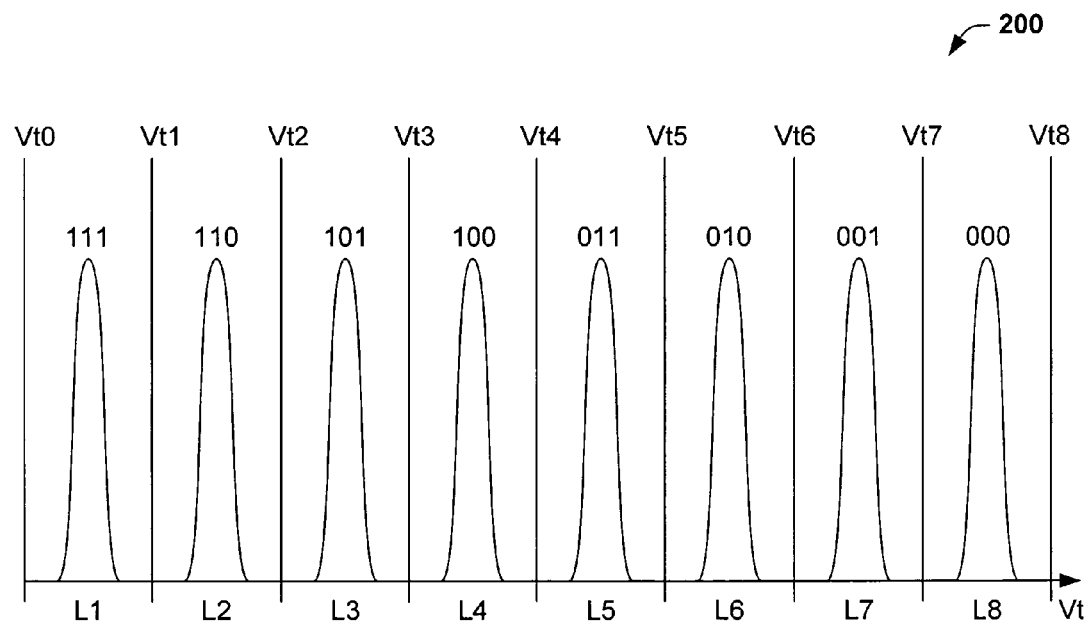
FIG. 2 is a Vt distribution of an eight level multi-level cell in accordance with an aspect of the present invention.

FIG. 2 illustrates another exemplary unsigned Vt distribution 200 of a single-bit eight level cell in accordance with an aspect of the present invention. Vt distribution 200 of FIG. 2 represents a population of memory cell threshold voltages centered about eight discrete target threshold voltages. Each target threshold voltage occupies a range of Vt values designated levels L1 thru L8. Ideally, each level would be centered between upper and lower Vt limits, for example, Vt0 thru Vt8. The various levels may be arbitrarily assigned corresponding binary states (e.g., L1=111, L2=110, L3=101, thru L8=000, or L1=000, L2=001, L3=010, thru L8=111) as desired by the user. Again, no polarity is assigned to Vt distribution 200, as the method of the present invention is suitably implemented in MLB memory devices having any combination of both positive and negative Vt distributions. In the event a dual-bit cell is employed (having two physically distinct bit locations), an eight level cell would correspond to 64 available data states.

Figure 3:
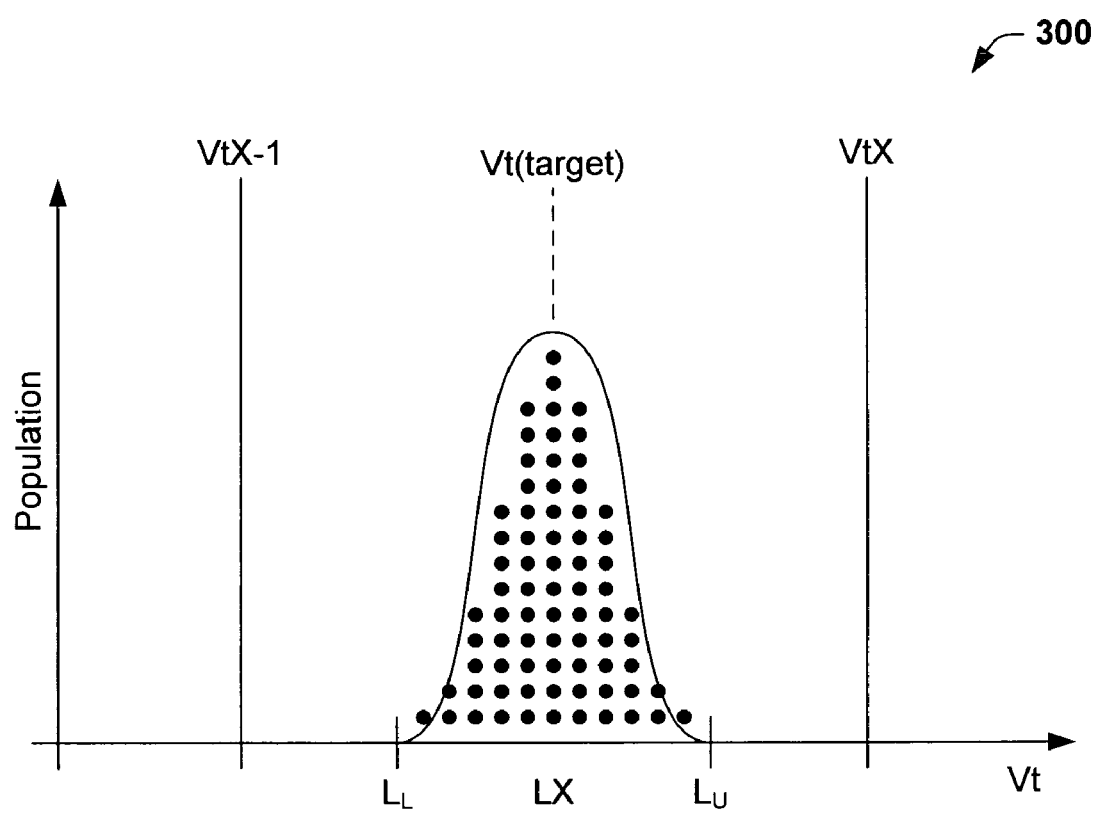
FIG. 3 is a Vt distribution of one exemplary level of a cell, the distribution centered around a target Vt and having upper and lower population boundary levels in accordance with an aspect of the present invention and as depicted in FIGS. 1 and 2.

FIG. 3 illustrates a Vt distribution 300 of a population of Vt values at one exemplary level of a multi-level cell in accordance with the present invention and as depicted in FIGS. 1 and 2. The exemplary level LX of Vt distribution 300 is ideally centered around a target Vt(target) having upper and lower population boundary levels $L_U$ and $L_L$, respectively. The population of Vt values is further ideally centered between upper and lower Vt limits VtX−1 and VtX, but can vary. An objective of the method of the present invention is to narrow, or "compact" the population boundary levels $L_U$ and $L_L$ closer to one another. Sigma is often used to symbolize the standard deviation of such a population, which is a measure of the variability of the population. Accordingly, a smaller sigma indicates a narrower Gaussian distribution of the population, indicating that more cell threshold voltages are populated closer to the target Vt(target).

The contributors of the present invention have realized that to get a predictable and well-controlled programmed Vt distribution from MLB cells, one solution is to first bring all cells within a group to a common erased state, which has a predictably well controlled erased Vt distribution. The contributors of the present invention have further observed and appreciated that each time an operation is performed on a particular group of memory cells that the group progressively tends to compact or filter themselves closer to the same Vt potential. Accordingly, the inventors have devised an interactive method of iteratively erasing, programming, and soft programming the cells in two or more phases between two or more discrete Vt level values. These iterative operations tend to progressively cause the cell distributions to narrow and compact the cells to a common data state.

For example, in one aspect of the present invention, erase operations are used to insure that the slowest erasing bits conform to $Vt<=L_U$ level, while programming and soft programming operations are used to insure that the lowest Vt bits conform to $Vt>=L_L$ level. Stated another way, in one aspect of the present invention, erase operations may be used to reduce the Vt population of cells from the $L_U$ boundary toward the target Vt(target), while in another method aspect, programming and soft programming may be used to raise the Vt population of cells from the $L_L$ boundary toward the target Vt(target) value. As a result, the inventors have observed that, beneficially, the sigma of the Vt population decreases and compacts the bits with each successive alternate operation attempting to move the Vt in opposite directions, for example, an erase operation followed by a soft program operation, then an erase, etc. The method of the present invention has similarities to the technique of successive approximation, in that the Vt distribution population of the cells is progressively fine-tuned toward the target Vt(target) value with each successive operation. As a result, this method may be faster and more energy efficient than some other conventional single phase methods.

A sector or group erase algorithm implemented in one or more sectors or groups of an array of suitable flash MLB flash memory cells facilitates the method of the present invention. The algorithm of the present invention may be applied in two or more erase phases (or tiers), for example, and erases the selected sector(s) to a single data state for improved subsequent programming operations. The algorithm achieves well controlled compact Vt distributions of the multi-level memory cells, thereby effectively allowing for higher device density and memory capacity with improved erase speed and efficiency. The erase algorithm and method of the invention is interactively applied and uniformly distributed across each sector of the array in the two phases.

Although the methodology is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a one or more of the acts may be carried out in one or more separate acts or phases.

Figure 4A:
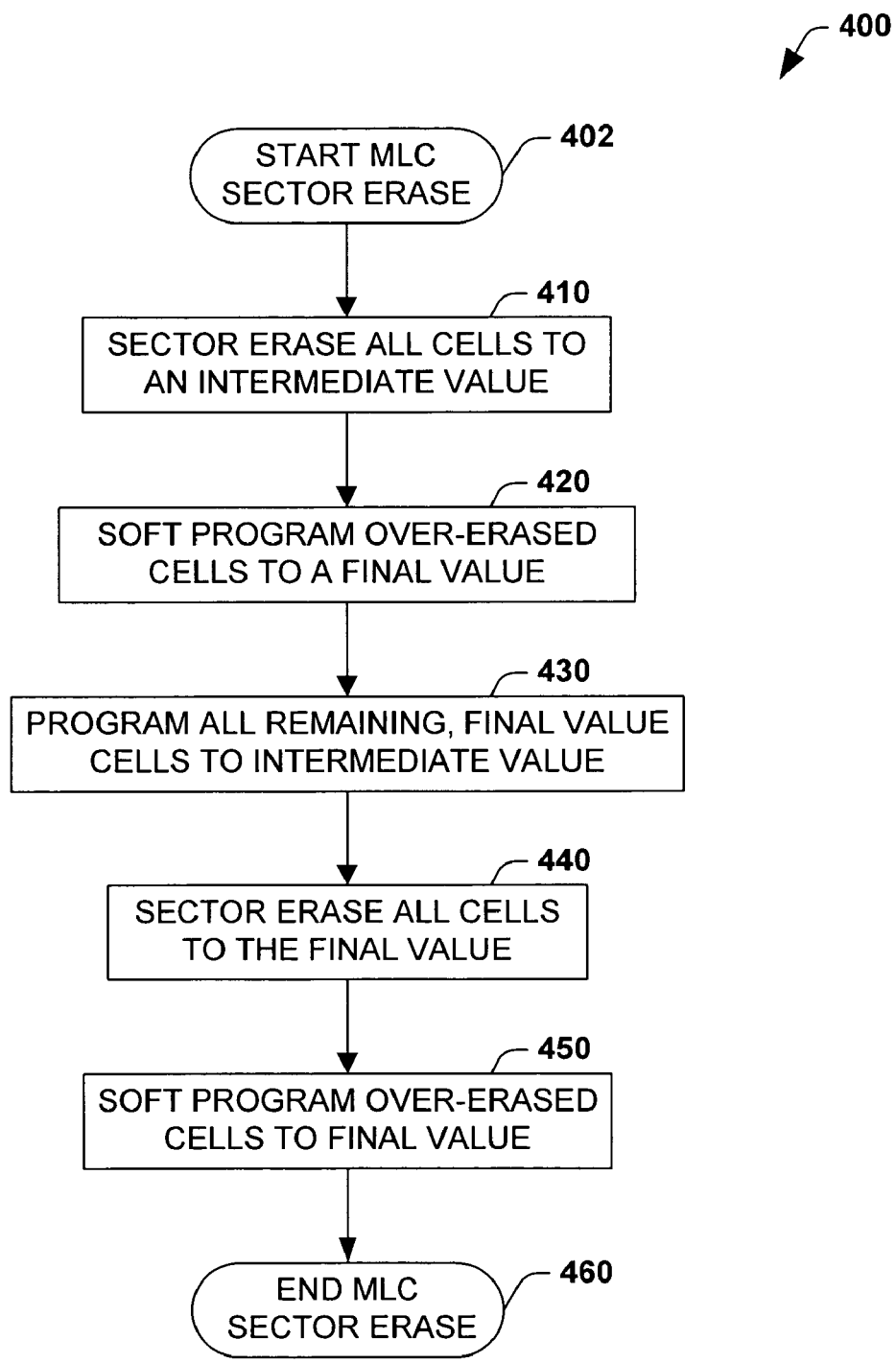
FIG. 4A is flow diagram illustrating an exemplary method of erasing a sector or array of MLB memory cells that includes a two-phase algorithm for interactively erasing memory cells in accordance with an aspect of the present invention.

FIG. 4A illustrates a flow diagram of an exemplary method 400 of erasing a sector or array of MLB flash memory cells in accordance with the present invention. While the term "sector: is use throughout, it should be understood that such term is not to be construed as limiting to one specified grouping of cells, but rather may apply to any grouping of MLB cells. FIGS. 4B-4F further illustrate flow diagrams of details of the various operations of the MLB sector erase method 400 of FIG. 4A. Assume for the sake of the following method discussion and the examples of FIGS. 4B-4F, a four-level flash memory cell similar to that of FIG. 1 with L1 representing a blank or erased state, and L4 representing the highest level. Although L1 will represent the erased state in this example, it should be appreciated that method 400 will work for any level assignments and Vt distribution polarities of MLB memory cells, and such variations are contemplated as falling with the scope of the present invention.

For example, method 400 of FIG. 4A includes a two-phase algorithm for interactively erasing the memory cells in accordance with the present invention. The first phase of method 400, for example, comprises steps 402, 410, 420, and 430, while the second phase comprises steps 440, 450, and 460. In the first phase of method 400, cells are essentially brought to an intermediate threshold voltage value (IV) (e.g., L2 of the four levels of FIG. 1), while in the second phase the cells are further erased to a final threshold voltage value (FV) (e.g., L1 of the four levels of FIG. 1, assuming L1 is used as the erased state).

Figure 4B:
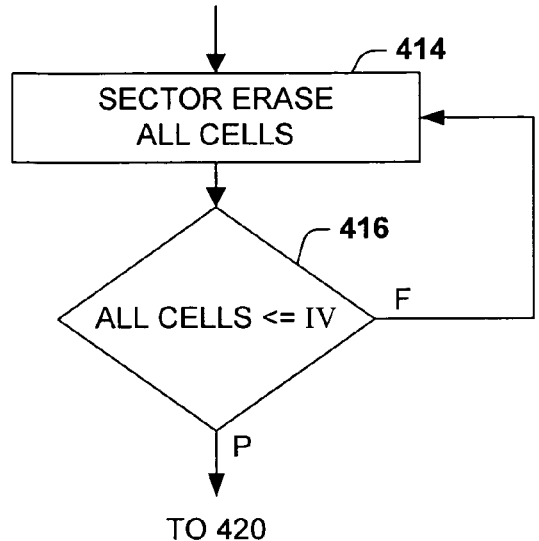
FIGS. 4B-4F are flow diagrams illustrating further details of various portions of the exemplary method of erasing a sector or array of MLB memory cells in accordance with the MLB sector erase method of FIG. 4A.

For example, the first phase of the MLB sector erase method 400 begins at 402, wherein different portions of the sector or array may be initially programmed to different levels (e.g., some to L1, L2, L3, or L4 levels of FIG. 1). At 410 all the memory cells within the selected sector or sectors of the array are erased to the intermediate value IV. Act 410 of FIG. 4B illustrates one implementation of interactively erasing and testing all the memory cells of a sector by iteratively applying erase pulses to the sector at 414 until it is determined at 416 that all the memory cells of a sector have been at least erased to the intermediate threshold voltage value IV (e.g., $Vt<=IV$, erasing all cells to L2 in FIG. 1).

Figure 4C:
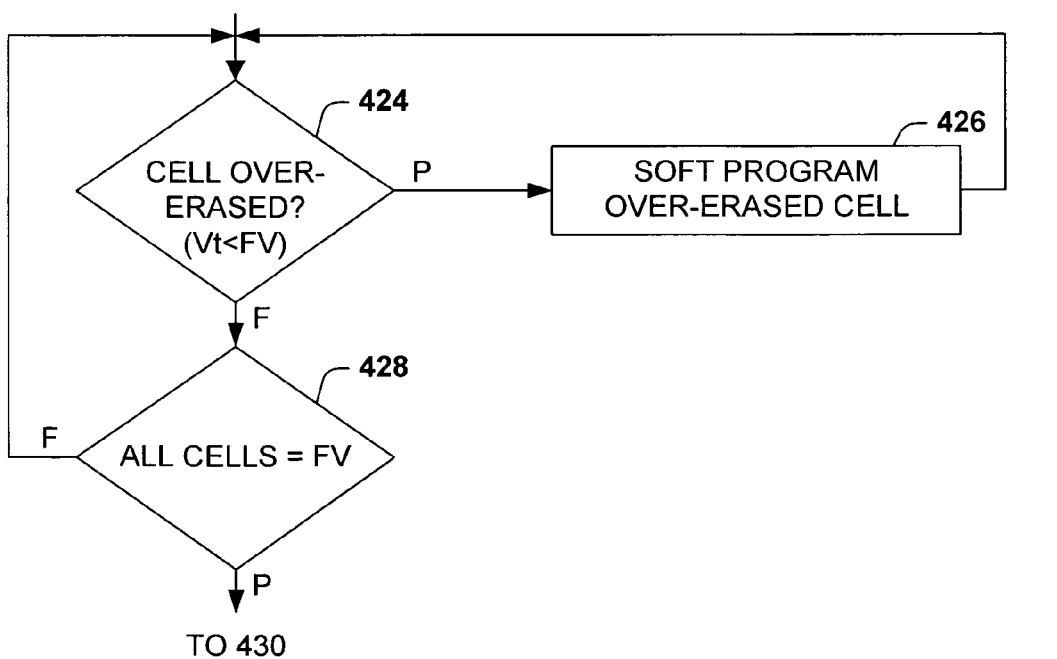

At 420, the over-erased cells from the erase operation of 410 are soft-programmed to the final value FV (e.g., soft-programming over-erased cells to L1 in FIG. 1). Act 420 of FIG. 4C illustrates one example of soft programming over-erased cells to the final value by iteratively verifying at 424 whether a selected cell is over-erased (Vt<FV), then applying a soft program pulse at 426 to the yet over-erased cell, and re-verifying the cell again at 424. This soft-programming and verifying process continues iteratively with each over-erased cell until at 428 it is determined that all over-erased are restored to the final value FV (e.g., L1 of FIG. 1).

Figure 4D:
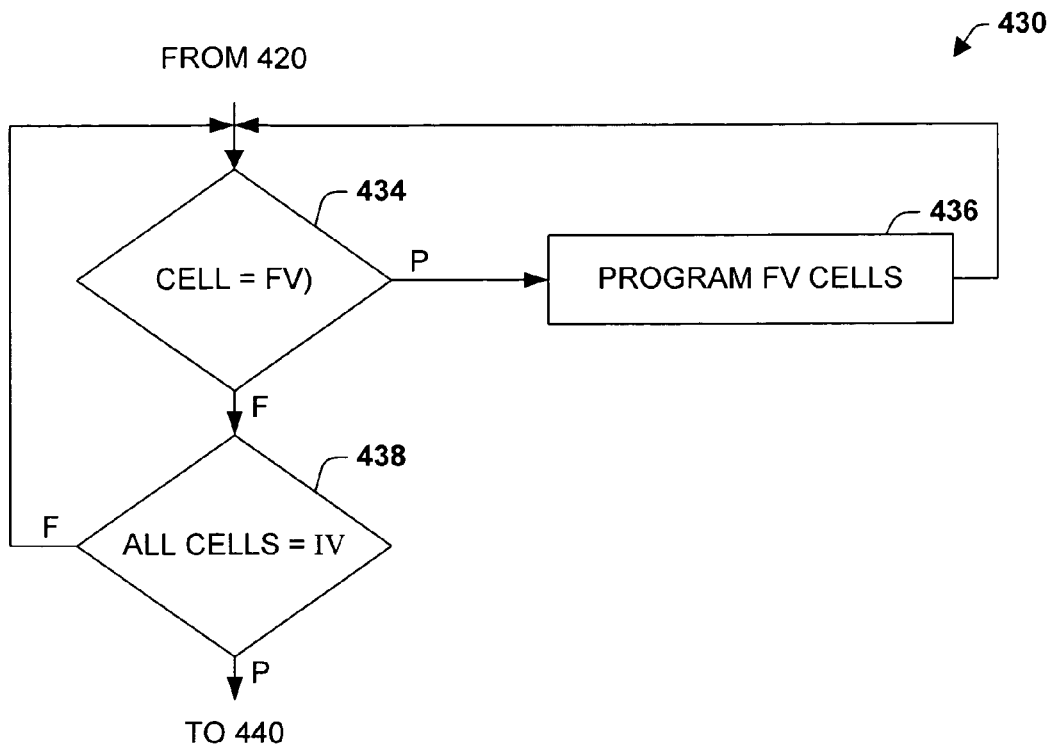

At 430 all remaining final value FV (e.g., at L1) cells are programmed to the intermediate value (e.g., to L2 of FIG. 1) to bring all cells of the sector to a single state. Act 430 of FIG. 4D illustrates one example of programming all the final value FV cells to the intermediate value IV by iteratively verifying at 434 whether a selected cell is still at FV (Vt=FV), then applying a program pulse at 436 if the cell remains at FV (e.g., at L1), and re-verifying the cell again at 434. This programming and verifying process continues iteratively with each FV level cell until at 438 it is determined that all FV level cells are programmed to the intermediate value IV (e.g., L2 of FIG. 1). At this point, and the end of the first phase, all the cells have been brought to the same intermediate value state, and have a modest Vt distribution sigma. The term final value cells in this example refers to cells that were initially programmed to the state that the entire sector will ultimately be erased to. In this example, that corresponds to cells that were already programmed to L1 at the beginning of the erase method 400.

Figure 4E:
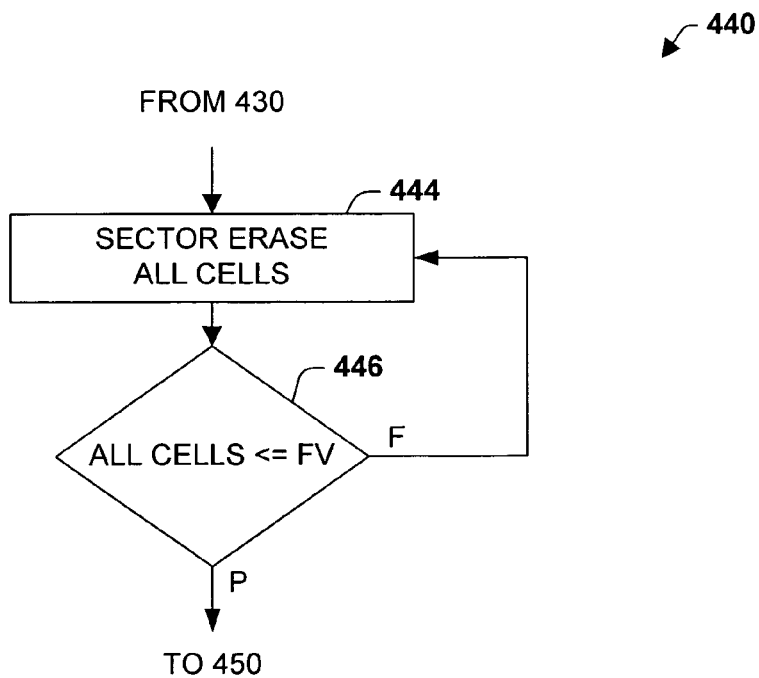

In the second phase of the MLB sector erase method 400, the sigma of the Vt distribution will be further improved. At 440 of FIG. 4A all the memory cells within the selected sector or sectors of the array are again erased, but this time to the final value FV (e.g., L1 of FIG. 1). Act 440 of FIG. 4E illustrates one example of interactively erasing and testing all the memory cells of a sector by iteratively applying erase pulses to the sector at 444 until it is determined at 446 that all the memory cells of a sector have been at least erased to the final value FV (e.g., Vt<=FV, erasing all cells to L1 in FIG. 1).

Figure 4F:
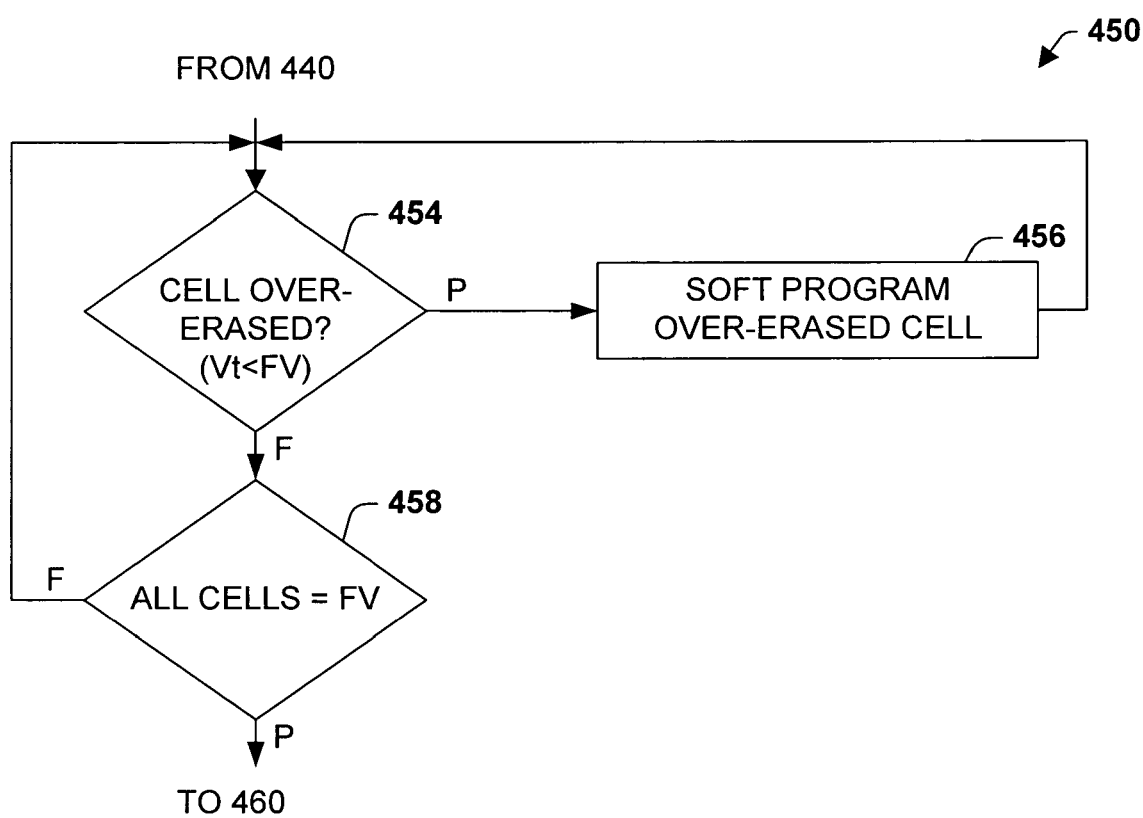

At 450, once again, the over-erased cells (e.g., Vt<FV) from the erase operation of 440 are soft-programmed to restore them to the final value FV (e.g., soft-programming over-erased cells to L1 in FIG. 1). Act 450 of FIG. 4F illustrates one example of soft programming over-erased cells to the final value by iteratively verifying at 454 whether a selected cell is over-erased (Vt<FV), then applying a soft program pulse at 456 to the yet over-erased cell, and re-verifying the cell again at 454. This soft-programming and verifying process continues iteratively with each over-erased cell until at 458 it is determined that all over-erased are restored to the final value FV (e.g., L1 of FIG. 1). Thereafter, method 400 ends at 460, wherein all MLB flash memory cells of the one or more sectors of the array have been brought to the same data state and to within a narrow Vt population distribution at an erased state centered about the final value FV.

In accordance with another aspect of the present invention, various voltages used in the erase, program, and soft-program operations of method 400 may be adjusted to further optimize and speed the algorithm and compacting of the bits.

Figure 5:
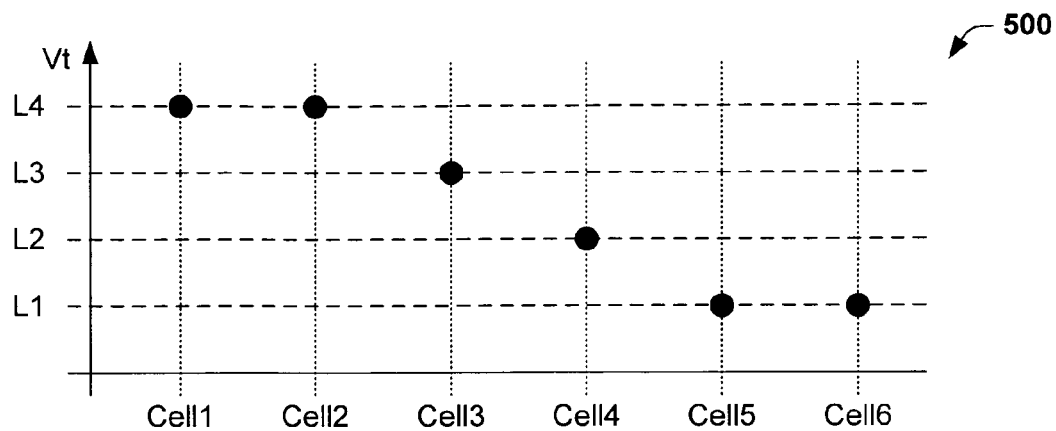
FIG. 5 is a plot of the Vt levels of several exemplary memory cells of a sector or array of MLB memory cells programmed to various initial logical states and corresponding Vt levels, such as may be suitable for sector erasing by the method of the present invention.

FIG. 5 illustrates a plot of the Vt levels of several exemplary memory cells of a sector or array of MLB flash memory cells programmed to various initial logical states and corresponding Vt levels, such as may be suitable for sector erasing by the method of the present invention. Subsequently, FIGS. 6-10 will then illustrate plots of the Vt levels of the exemplary memory cells of FIG. 5 resulting from the various processing steps of the MLB sector erase method of the present invention, for example, using the two-phase algorithm and method 400 of FIG. 4A.

For example, FIG. 5 illustrates a random selection and programming 500 of six memory cells Cell1, Cell2, Cell3, Cell4, Cell5, and Cell6 from different portions of a sector or array of memory cells. Cells 1-6 are initially programmed to various Vt levels (e.g., L1, L2, L3, and L4 of FIG. 1) corresponding to one of four logical states of, for example, a single-bit four-level MLB memory cell. For the example of FIG. 5, Cell1 is programmed to L4, Cell2 to L4, Cell3 to L3, Cell4 to L2, Cell5 to L1, and Cell6 to L1 as illustrated.

Figure 6:
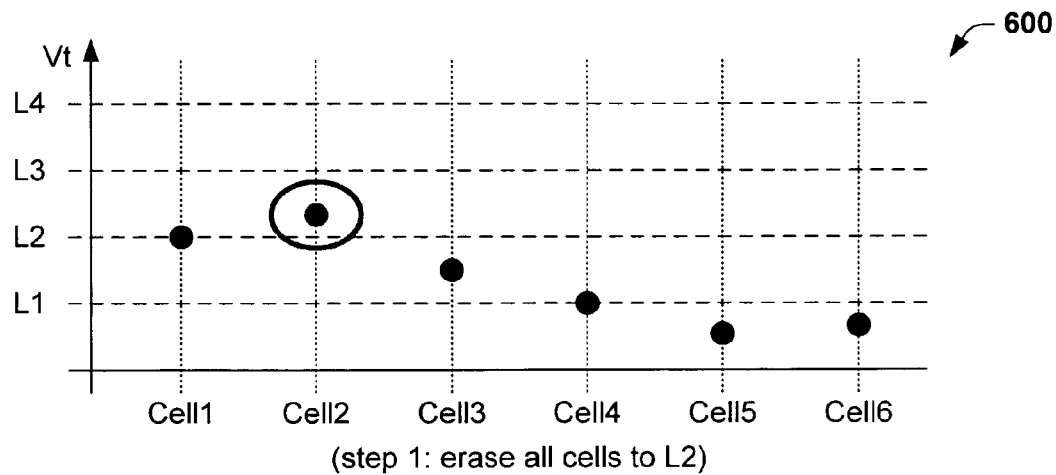
FIGS. 6-10 are plots of the Vt levels of the exemplary memory cells of FIG. 5 resulting from the processing steps of the MLB sector erase method of the present invention using the two-phase algorithm of FIG. 4A.

FIG. 6 illustrates the results 600 of the erase operation 410 of the first phase of method 400, wherein all the cells of the one or more sectors are erased to an intermediate threshold voltage value IV (e.g., the L2 level). The inventors have observed that cells generally erase somewhat proportionately to the level they originate from. For example, cells originating from the "higher" L4 level will generally change more by an erase pulse and the potential applied to the cell than will those cells originating from "lower" levels such as the L3, L2, and L1 levels. Thus, subsequent to one or more erase pulses, FIG. 6 shows that the cells have been shifted "down", and that the cells originating from the L3 and L4 have shifted a greater percentage than those originating from the L1 and L2 levels.

Invariably, one or more cells (e.g., Cell2) may have a marginally greater post-erase threshold and require more erase pulses (or more erasing potential) to finally arrive at the data state corresponding to the L2 level. However, as the erase operation 410 is a bulk operation, Cell5 and Cell6 originating from L1 may have, as a consequence, become over-erased (e.g., Vt<FV) as illustrated in FIG. 6 before Cell2 is sufficiently erased to the L2 level. Such cells require some level of programming and/or soft programming to correct the over-erased condition, as is addressed next by 420.

Figure 7:
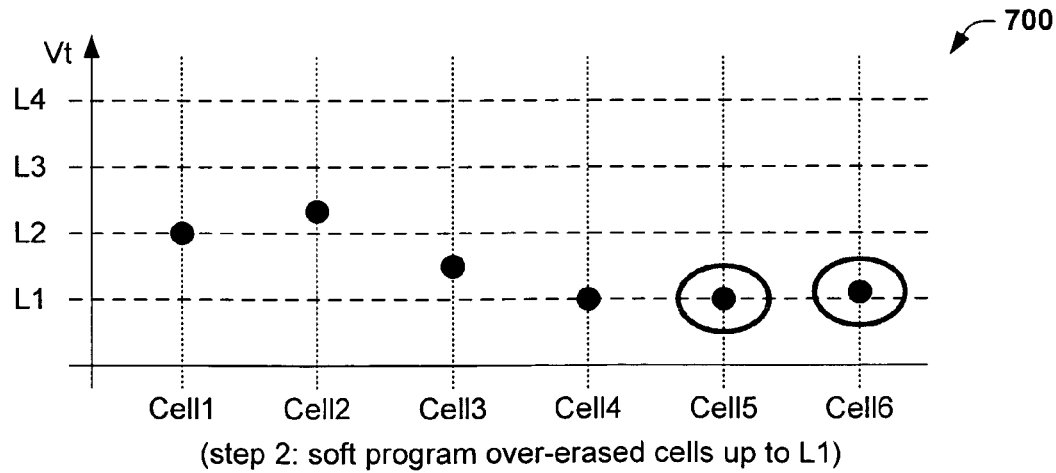

FIG. 7 illustrates the results 700 of the soft programming operation 420 of FIG. 4A of the first phase of method 400. Over-erased cells Cell5 and Cell6, for example, are soft-programmed (see, e.g., FIG. 4C) to restore them back to the final value FV (e.g., to L1 of FIG. 1).

Figure 8:
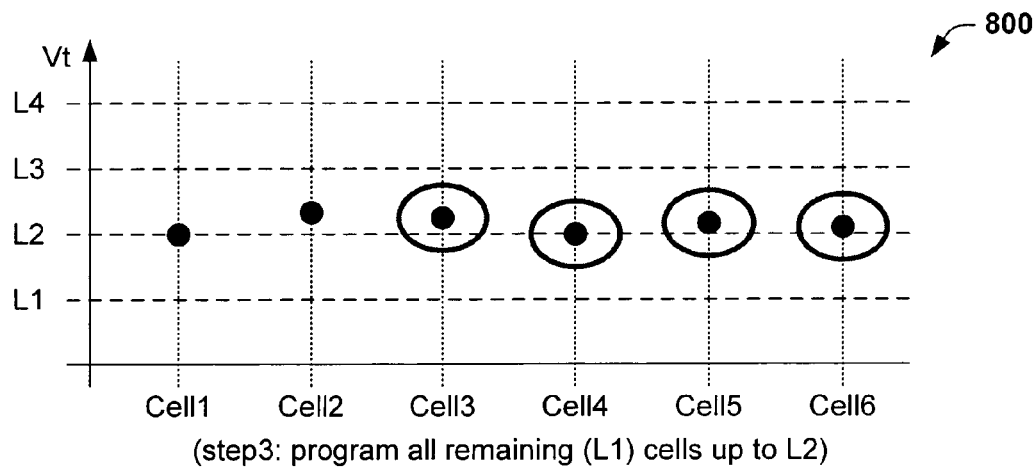

FIG. 8 illustrates the results 800 of the programming operation 430 of the first phase of method 400 of FIG. 4A. At 430 all the remaining final value FV cells, for example, those at or near L1 including Cell3, Cell4, Cell5, Cell6, are programmed to the intermediate value to bring all cells of the sector to a single state (e.g., to L2). As discussed, this may be accomplished by iteratively verifying a cell and applying program pulses to a cell until the cell achieves the intermediate value IV (e.g., L2 of FIG. 1). At this point, and the end of the first phase, all the cells have been brought to the same intermediate value state, and have a modest Vt distribution sigma, as illustrated in FIG. 8.

Figure 9:
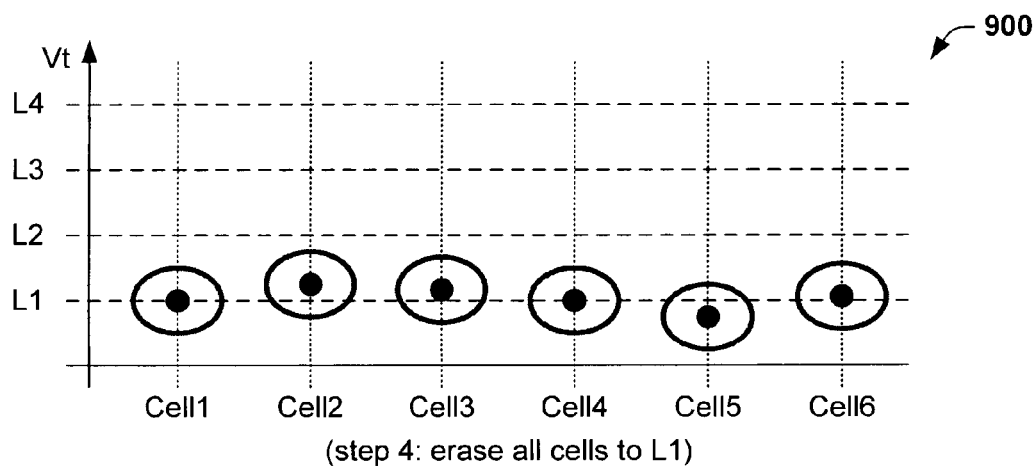

FIG. 9 illustrates the results 900 of the second erase operation 440 of the second phase of method 400 of FIG. 4A. In the second phase the sigma of the Vt distribution is further improved (decreased). At 440 all the memory cells within the selected sector or sectors of the array (Cell1-Cell6) are again erased, but this time to the final value FV (e.g., to L1). All the memory cells of a sector receive an iterative application of erase pulses (see, e.g., FIG. 4E) until it is determined that all the memory cells have been at least erased to the final value FV (e.g., to L1 in FIG. 1). Once again, however, this may leave a cell over-erased, as Cell5 indicates, if it is more responsive to the applied erase voltages than other cells in the sector.

Figure 10:
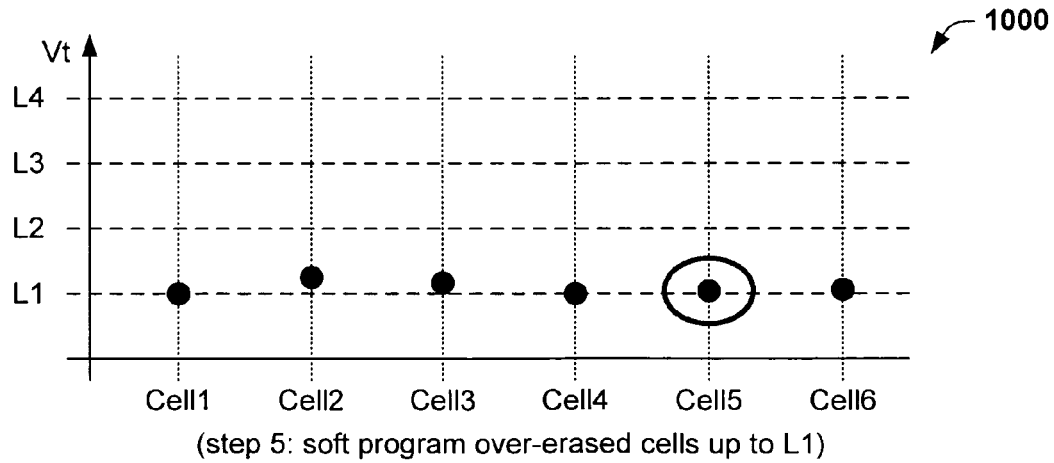

FIG. 10 illustrates the results 1000 of the second soft programming operation 450 of the second phase of method 400. At 450, the over-erased cells (e.g., Vt<FV) from the erase operation of 440, are once again soft-programmed to restore them to the final value FV (e.g., to L1). Cell5, for example, may be iteratively verified and soft programmed with a soft program pulse and re-verified until the cell is determined to be restored to the final value FV (e.g., L1 of FIG. 1).

Thereafter, the method 400 ends having erased all the exemplary MLB flash memory cells (Cell1-Cell6) of the one or more sectors of the array to the same data state and to within a narrow Vt population distribution at an erased state centered about the final value FV (e.g., L1).

Note, that further phases may be used at selected additional intermediate level values between the intermediate value IV and the final value FV. For example, if eight-level MLB memory cells had been used, a first IV may have been established at L6, a second IV at L4, a third IV at L2, and the final value FV at L1. In another example, if eight-level MLB memory cells had been used, a first IV may have been established at L3, a second IV at L5, and a final value FV at L6 as the erased state.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of erasing a sector of memory cells to a single data state, the memory cells having three or more data states corresponding to three or more threshold voltage values, the method comprising:
    performing a block erase operation on the sector of memory cells until all cells of the sector are erased to a threshold voltage generally corresponding to an intermediate value;
    performing a soft programming operation on an over-erased memory cell of the sector until the threshold voltage of the over-erased memory cell generally corresponds to a final value;
    programming memory cells of the sector determined to be at or near a threshold voltage corresponding to the final value until the threshold voltage of the memory cells generally correspond to the intermediate value;
    re-performing the block erase operation on the sector until all cells of the sector are erased to the threshold voltage generally corresponding to the final value; and
    re-performing a soft programming operation on an over-erased memory cell of the sector until the threshold voltage corresponding to the final value is attained.

2. The method of claim 1, wherein the performing a block erase operation on the sector of memory cells until all cells of the sector are erased to a threshold voltage generally corresponding to an intermediate value further comprises:
    verifying the block erase operation of the memory cells by identifying whether the threshold voltage of the memory cells generally correspond to the intermediate value; and
    re-performing the block erase operation on the sector of memory cells until all cells of the sector are determined to have a threshold voltage generally corresponding to the intermediate value.

3. The method of claim 2, wherein verifying the block erase operation includes identifying erased memory cells by measuring threshold voltage values generally corresponding to bits of respective memory cells of the sector and comparing the measured values with a minimum erase threshold voltage value.

4. The method of claim 1, wherein the performing a soft programming operation on an over-erased memory cell of the sector until the threshold voltage of the over-erased memory cell generally corresponds to the intermediate value comprises:
    identifying an over-erased memory cell in the sector;
    performing a soft programming operation on the over-erased memory cell;
    verifying the soft programming operation of the over-erased memory cell by identifying whether the threshold voltage of the over-erased memory cell corresponds to the final value; and
    re-performing the soft programming operation on the over-erased memory cell until the over-erased memory cell of the sector is determined to have a threshold voltage corresponding to the final value.

5. The method of claim 1, wherein the programming memory cells of the sector determined to be at or near a threshold voltage corresponding to the final value until the threshold voltage of the memory cells generally correspond to the intermediate value comprises:
    identifying a group of remaining memory cells in the sector having a threshold voltage corresponding to the final value;
    programming all remaining memory cells of the sector determined to be at or near a threshold voltage generally corresponding to the final value;
    verifying the programming operation of the memory cells by identifying whether the threshold voltage of the memory cells generally correspond to the intermediate value; and
    re-programming the remaining memory cells of the sector determined to be at a threshold voltage corresponding to the final value until the memory cells are determined to have a threshold voltage generally corresponding to the intermediate value.

6. The method of claim 1, wherein the re-performing the block erase operation on the sector until all cells of the sector are erased to the threshold voltage generally corresponding to the final value comprises:
    verifying the block erase operation of the memory cells by identifying whether the threshold voltage of the memory cells generally correspond to the final value; and
    re-performing the block erase operation on the sector of memory cells until all cells of the sector are determined to have a threshold voltage generally corresponding to the final value.

7. The method of claim 1, wherein the re-performing a soft programming operation on an over-erased memory cell of the sector until the threshold voltage generally corresponding to the final value is attained comprises:
    verifying the soft programming operation of the over-erased memory cells by identifying whether the threshold voltage of the over-erased memory cells generally correspond to the final value; and
    re-performing the soft programming operation on the over-erased memory cells until the over-erased memory cells of the sector are determined to have a threshold voltage generally corresponding to the final value.

8. The method of claim 1, wherein the threshold voltage of the intermediate value is a higher voltage than the threshold voltage of the final value.

9. The method of claim 1, wherein the intermediate and final threshold voltage values individually correspond to one of the three or more data states generally corresponding to the three or more threshold voltage values.

10. The method of claim 1, wherein the memory cells having three or more data states generally corresponding to three or more threshold voltage values correspond to memory cells having four data states and four threshold voltage values.

11. The method of claim 1, further comprising additional erasing and soft programming operations to the memory cells for bringing the threshold voltage of the memory cells to one or more additional threshold voltage values between the intermediate and final threshold voltages to provide further bit compacting.

12. The method of claim 1, wherein the intermediate and final threshold voltage values are predetermined by a memory device user.

13. The method of claim 12, wherein the intermediate and final threshold voltage values are input by the user to circuitry associated with the memory cells.

14. The method of claim 12, wherein the final threshold voltage value is about half the voltage of the intermediate threshold voltage value.

15. The method of claim 1, further comprising pre-programming a portion of the memory cells prior to performing the block erase operation.

16. The method of claim 1, wherein the block erase operation reduces threshold voltage values generally corresponding to bits of respective memory cells of the sector.

17. The method of claim 1, wherein different portions of the sector of memory cells are initially programmed to different threshold voltage values.

18. The method of claim 1, wherein the sector of memory cells comprises a portion of a larger array of memory cells, wherein different portions of the array of memory cells are initially programmed to different threshold voltage values.

19. The method of claim 1, wherein one or more sectors of memory cells comprise an array of memory cells, wherein different sectors of the array are initially programmed to different threshold voltage values.

20. The method of claim 1, wherein the sector of memory cells is erased to an L1 data state, the memory cells have four data states L1, L2, L3, and L4 corresponding to four respective threshold voltage values, and wherein the intermediate threshold voltage value corresponds to the L2 data state and the final threshold voltage value corresponds to the L1 data state.

21. The method of claim 1, wherein one or more voltages used in the erase, program, and soft-program operations are adjusted to further optimize the method.

22. A method of erasing a group of memory cells having three or more threshold voltage values, the method comprising:
   performing a block erase operation on the group of memory cells until all cells of the group are erased to a threshold voltage corresponding to an intermediate value;
   performing a soft programming operation on each over-erased memory cell of the group until the threshold voltage of the over-erased memory cells generally correspond to a final value;
   programming all remaining memory cells of the group determined to be at a threshold voltage corresponding to the final value until the threshold voltage of the remaining memory cells correspond to the intermediate value;
   re-performing the block erase operation on the group until all cells of the group are erased to the threshold voltage corresponding to the final value; and
   re-performing a soft programming operation on each over-erased memory cell of the group until the threshold voltage corresponding to the final value is attained.

23. The method of claim 22, wherein the performing a block erase operation on the group of memory cells until all cells of the group are erased to a threshold voltage generally corresponding to an intermediate value further comprises:
   verifying the block erase operation of the memory cells by identifying whether the threshold voltage of the memory cells corresponds to the intermediate value; and
   re-performing the block erase operation on the group of memory cells until all cells of the group are determined to have a threshold voltage corresponding to the intermediate value.

24. The method of claim 23, wherein verifying the block erase operation includes identifying erased memory cells by measuring threshold voltage values corresponding to bits of respective memory cells of the group and comparing the measured values with a minimum erase threshold voltage value.

25. The method of claim 22, wherein the performing a soft programming operation on each over-erased memory cell of the group until the threshold voltage of the over-erased memory cells generally correspond to a final value comprises:
   identifying a set of over-erased memory cells in the group;
   performing a soft programming operation on each over-erased memory cell in the group;
   verifying the soft programming operation of the over-erased memory cells by identifying whether the threshold voltage of the over-erased memory cells correspond to the final value; and
   re-performing the soft programming operation on the over-erased memory cells until the over-erased memory cells of the group are determined to have a threshold voltage corresponding to the final value.

26. The method of claim 22, wherein the programming all remaining memory cells of the group determined to be at a threshold voltage corresponding to a final value until the threshold voltage of the remaining memory cells correspond to the intermediate value comprises:
   identifying a set of remaining memory cells in the group having a threshold voltage corresponding to the final value;
   programming all remaining memory cells of the group determined to be at a threshold voltage corresponding to the final value;
   verifying the programming operation of the memory cells by identifying whether the threshold voltage of the memory cells correspond to the intermediate value; and
   re-programming the remaining memory cells of the group determined to be at a threshold voltage corresponding to the final value until the memory cells are determined to have a threshold voltage corresponding to the intermediate value.

27. The method of claim 22, wherein the re-performing the block erase operation on the group until all cells of the group are erased to the threshold voltage corresponding to the final value comprises:
   verifying the block erase operation of the memory cells by identifying whether the threshold voltage of the memory cells correspond to the final value; and
   re-performing the block erase operation on the group of memory cells until all cells of the group are determined to have a threshold voltage corresponding to the final value.

28. The method of claim 22, wherein the re-performing a soft programming operation on each over-erased memory cell of the group until the threshold voltage corresponding to the final value is attained comprises:

verifying the soft programming operation of the over-erased memory cells by identifying whether the threshold voltage of the over-erased memory cells correspond to the final value; and re-performing the soft programming operation on the over-erased memory cells until the over-erased memory cells of the group are determined to have a threshold voltage corresponding to the final value.

29. The method of claim 22, wherein the threshold voltage of the intermediate value is a higher voltage than the threshold voltage of the final value.

30. The method of claim 22, wherein the intermediate and final threshold voltage values individually correspond to one of the three or more data states generally corresponding to the three or more threshold voltage values.

31. The method of claim 22, wherein the memory cells having three or more data states generally corresponding to three or more threshold voltage values corresponds to memory cells having four data states and four threshold voltage values.

32. The method of claim 22, further comprising additional erasing and soft programming operations to the memory cells for bringing the threshold voltage of the memory cells to one or more additional threshold voltage values between the intermediate and final threshold voltages to provide further bit compacting.

33. The method of claim 22, wherein the intermediate and final threshold voltage values are predetermined by a memory device user.

34. The method of claim 33, wherein the intermediate and final threshold voltage values are input by the user to circuitry associated with the memory cells.

35. The method of claim 33, wherein the final threshold voltage value is about half the voltage of the intermediate threshold voltage value.

36. The method of claim 22, further comprising pre-programming a portion of the memory cells prior to performing the block erase operation.

37. The method of claim 22, wherein the block erase operation reduces threshold voltage values corresponding to bits of respective memory cells of the group.

38. The method of claim 22, wherein different portions of the group of memory cells are initially programmed to different threshold voltage values.

39. The method of claim 22, wherein the group of memory cells comprises a portion of a larger array of memory cells, wherein different portions of the array of memory cells are initially programmed to different threshold voltage values.

40. The method of claim 22, wherein one or more groups of memory cells comprise an array of memory cells, wherein different groups of the array are initially programmed to different threshold voltage values.

41. The method of claim 22, wherein the groups of memory cells are erased to an L1 data state, the memory cells have four data states L1, L2, L3, and L4 corresponding to four respective threshold voltage values, and wherein the intermediate threshold voltage value corresponds to the L2 data state and the final threshold voltage value corresponds to the L1 data state.

42. The method of claim 22, wherein one or more voltages used in the erase, program, and soft-program operations are adjusted to further optimize the method.

* * * * *